United States Patent [19]
Jung et al.

[11] Patent Number: 5,879,839
[45] Date of Patent: Mar. 9, 1999

[54] PHOTOMASK HAVING A HALF-TONE TYPE PHASE SHIFT MATERIAL AND CHROME PATTERN ON A TRANSPARENT SUBSTRATE

[75] Inventors: Woo Yung Jung; Tae Gook Lee, both of Kyoungido, Rep. of Korea

[73] Assignee: Hyundai Electronics Industries Co., Ltd., Kyoungkido, Rep. of Korea

[21] Appl. No.: 879,807

[22] Filed: Jun. 20, 1997

[30] Foreign Application Priority Data

Jun. 29, 1996 [KR] Rep. of Korea .................. 1996-26504

[51] Int. Cl.⁶ ....................................................... G03F 9/00
[52] U.S. Cl. ................................................................ 430/5
[58] Field of Search ............................... 430/5, 322, 324, 430/311, 314

[56] References Cited

U.S. PATENT DOCUMENTS 5,286,581  2/1994  Lee ............................................... 430/5
5,477,058  12/1995  Sato .............................................. 430/5
5,514,500  5/1996  Ham .............................................. 430/5
5,591,550  1/1997  Choi et al. ..................................... 430/5

*Primary Examiner*—S. Rosasco
*Attorney, Agent, or Firm*—Jacobson, Price, Holman & Stern, PLLC

[57] ABSTRACT

A half-tone phase shift mask capable of preventing light from being transmitted in undesired areas, and thus capable of obtaining desired fine patterns. The present invention is to provide a photomask for simultaneously forming photoresist patterns on a first area in which fine patterns are to be formed and on a second area in which relatively large photoresist patterns are to be formed in a semiconductor device. The photomask comprises a transparent substrate, half-tone phase shift patterns disposed on the first area of the transparent substrate and light screen patterns disposed on the second area of the transparent substrate.

8 Claims, 3 Drawing Sheets

PHOTOMASK HAVING A HALF-TONE TYPE PHASE SHIFT MATERIAL AND CHROME PATTERN ON A TRANSPARENT SUBSTRATE

BACKGROUND OF THE INVENTION

1. Field of the Invention

The present invention relates to a phase shift mask, and more particularly to a half-tone phase shift mask capable of preventing light from being transmitted in undesired areas, and thus capable of obtaining desired fine patterns.

2. Description of the prior Art

With the development of the highly integrated circuits, such as highly integrated dynamic random access memory devices, the demand for fine patterns is on the increase. In an effort to reduce the pattern size, a half-tone phase shift mask has been developed.

Generally, a half-tone phase shift mask is comprised of a quartz substrate and mask patterns including two layers, a light screen material layer and a phase shift material layer. In the half-tone phase shift mask, the light screen material layer is made of a chrome layer which transmits an incident light to a predetermined transmissivity. The phase shift material layer formed on the light screen material layer plays the role of shifting the phase of light at an angle of 180. Such a phase shift mask is designed to keep constant the amplitude of light illuminated on a wafer in the light exposing process and to minimize the light intensity caused by the interference between the light passing through the phase shift material layer and the light passing through the adjacent quartz substrate, thereby improving the resolution of the photosensitive film patterns.

FIG. 1 is a cross sectional view of photosensitive film patterns with a conventional half-tone phase shift mask. As shown in FIG. 1, positive photosensitive film patterns 15 formed on a semiconductor substrate 14 are shown with a conventional half-tone phase shift mask and the path of the incident light 16. A transparent substrate 11 has mask patterns which are made of two material layers, a chrome layer 12 and a phase sifting material layer 13. The chrome layer 12 has such a thickness so as to provide a predetermined transmissivity.

The area, which is not intended to be exposed, may be illuminated by the exposing light transmitting the mask patterns formed on the mask substrate. This causes the formation of an uneven surface on the top of the photosensitive film patterns 15. The size of the uneven surface on the photosensitive film patterns increase in proportion to the size of the mask patterns and decreases in proportion to the distance between the patterns.

Such photosensitive film patterns having an uneven surface decrease the reliability of the semiconductor devices and their yield. For example, when a photosensitive film formed by a conventional half-tone phase shift mask is used as an etching mask or as an ion implanting mask, a layer under the mask may be damaged or ions may be implanted into unintended areas.

In particular, in the process of exposing the positive photosensitive film coated on a semiconductor substrate using such a conventional half-tone phase shift mask, the area which is not intended to be exposed may become illuminated because of the transmissivity of the light passing through the mask patterns. The incident light passes through the mask patterns in the unintended areas and the intensity of the passing light is not uniform over the unintended areas. As a result, photosensitive film patterns having uneven surfaces are formed. These photosensitive film patterns have the desired height only on the edge thereof. However, the center of the photosensitive film in the area, which is not intended to be exposed, is illuminated by the passing light having weak intensity and variable kinds of intensity. Accordingly, in the process of developing, the center portion of the photosensitive film in the unintended area may be removed at different thicknesses according to the size thereof.

When light is illuminated on such a half-tone phase shift mask, the intensity of light is maximized at the center portion of a transmission region, which has no mask pattern, and the light intensity is reduced to zero at the edge of the transmission region. As stated above, the light intensity peak at the light screen areas provided with mask patterns may be detected, although it is very weak. The peak of light intensity detected in the light screen area is called a side-lobe peak.

SUMMARY OF THE INVENTION

Therefore, the present invention has been made in view of the above mentioned problems, and the object of the present invention is to provide a photomask having half-tone phase shift patterns in a cell area and light blocking patterns in a peripheral circuit area, thereby minimizing the side-lobe intensity peak of the expose light.

In accordance with an aspect of the present invention, there is provided a photomask for forming photoresist patterns in a semiconductor device, the photomask comprising: a transparent substrate; half-tone phase shift patterns disposed on said substrate, wherein said half-tone phase shift patterns are formed with two layers, a transmission layer having a predetermined transmissivity of an incident light and a phase shift material layer formed on said transmission layer; and light screen patterns disposed on said substrate, blocking the incident light used in a light exposure process.

In accordance with another aspect of the present invention, there is provided a photomask for simultaneously forming photoresist patterns on a first area in which fine patterns are to be formed and on a second area in which relatively large photoresist patterns are to be formed in a semiconductor device, the photomask comprising: a transparent substrate; half-tone phase shift patterns disposed on said first area of said substrate, wherein said half-tone phase shift patterns are formed with two layers, a transmission layer having a predetermined transmissivity of an incident light and a phase shift material layer formed on said transmission layer; light screen patterns disposed on said second area of said substrate, blocking the incident light used in the light exposure process, wherein said light screen patterns are larger than said half-tone phase shift patterns; and a dummy pattern in a boundary area between said first area in which said half-tone phase shift patterns are formed and said second area in which said light screen patterns are formed.

BRIEF DESCRIPTION OF THE DRAWINGS

These and other objects, features and advantages of the present invention will be more fully apparent from the description of the preferred embodiments with reference to the accompanying drawings, in which.

DETAILED DESCRIPTION OF THE PREFERRED EMBODIMENTS

An embodiment of the present invention will be described in detail below with reference to FIGS. 2 and 3.

Figure 1:
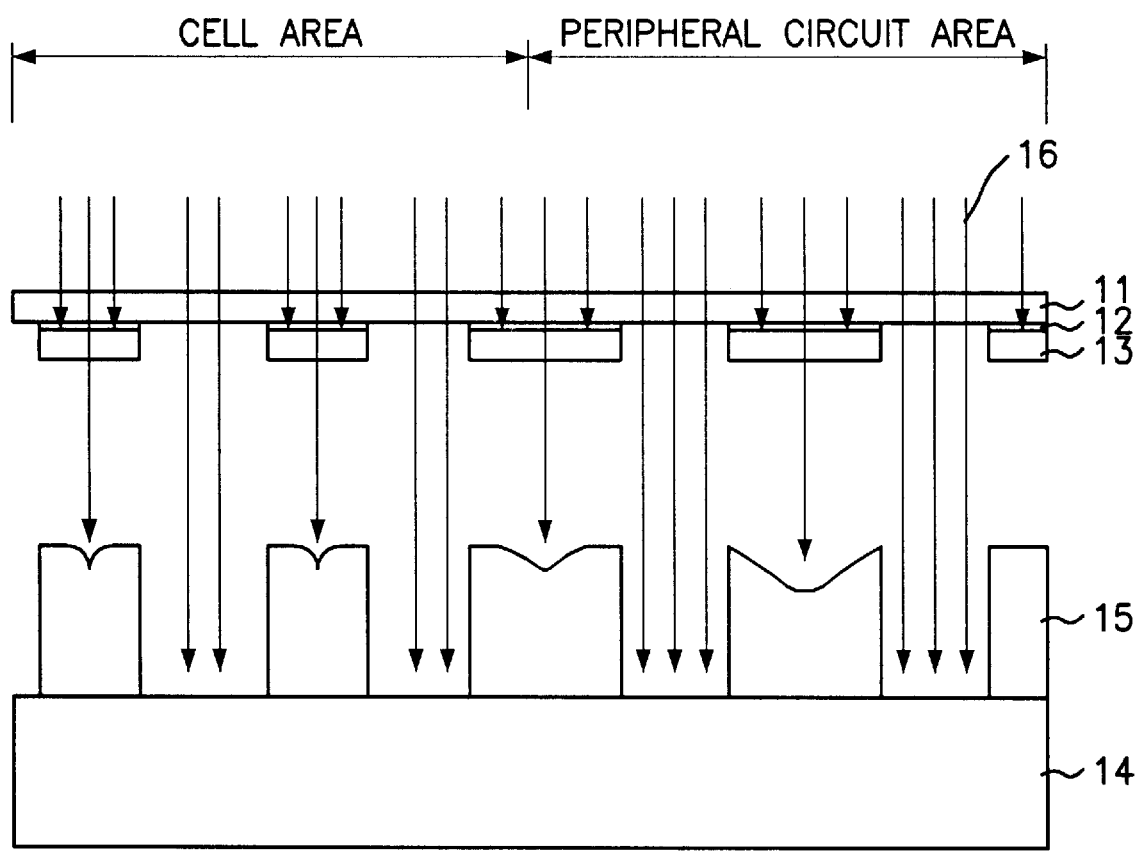
FIG. 1 is a cross sectional view of photosensitive film patterns with a conventional half-tone phase shift mask.
Figure 2A:
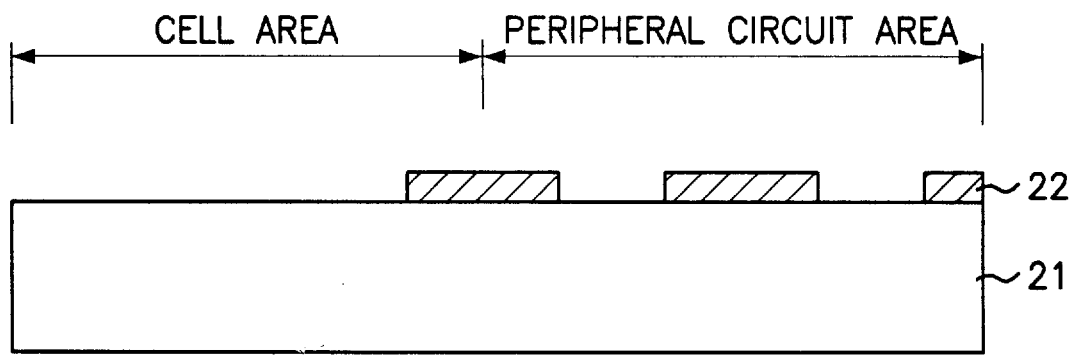
FIGS. 2A to 2C are cross sectional views showing a method forming a half-tone phase shift mask according to the present invention.
Figure 2B:
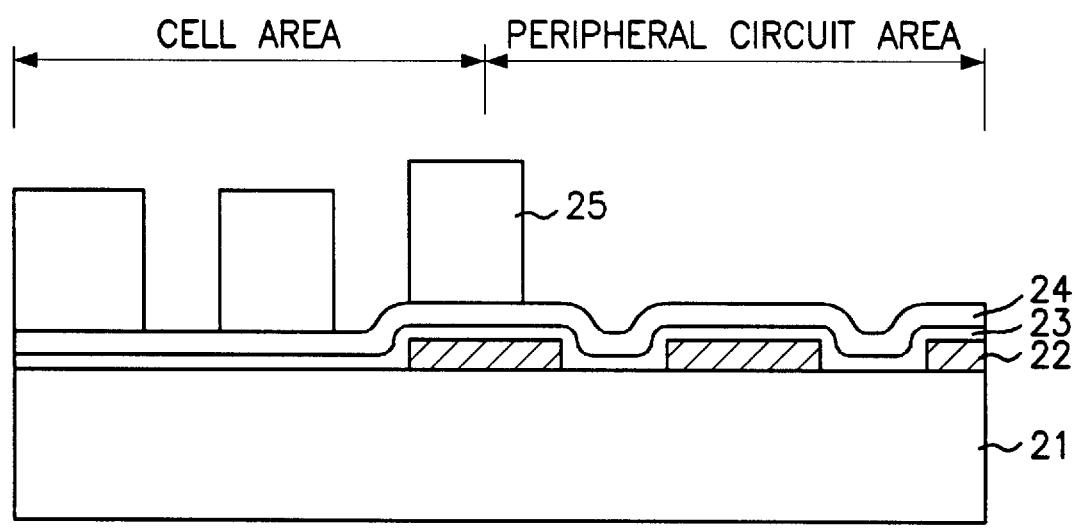
Figure 2C:
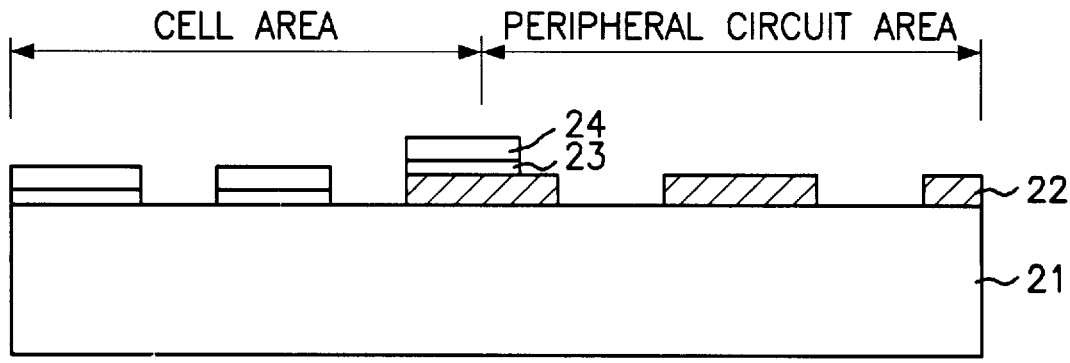

A method for forming a half-tone phase shift mask according to the present invention is shown in FIGS. 2A to 2C.

First, referring to FIG. 2A, chrome patterns 22, which completely block an incident light, are formed on a transparent substrate 21, such as a quartz substrate. The chrome patterns 22 are the mask patterns to screen light in the peripheral circuit region of semiconductor devices. In the peripheral circuit region, relatively large patterns are integrated and the size of spaces between the patterns are small. The chrome patterns 22 have transmissivity of 0%, so that the large patterns formed in the peripheral circuit do not have an uneven surface.

Referring to FIG. 2B, a chrome layer 23, which has such a thickness so as to permit the transmission of a predetermined rate of incident light, and a phase shift material layer 24 are, in order, formed on the resulting structure. Thereafter, photosensitive film patterns 25 for forming half-tone phase shift patterns are formed on a predetermined region of the transparent substrate 21. The photosensitive film patterns 25 are used as an etching mask to form half-tone phase shift patterns. The phase shift patterns are mask patterns for forming the patterns in the cell areas of semiconductor devices.

Referring next to FIG. 2C, the chrome layer 23 and the phase shift material layer 24 are etched using the photosensitive film patterns as an etching mask, so that half-tone phase shift patterns are formed. Thereafter, the photosensitive film patterns 25 are removed. In the above mentioned processes for fabricating the half-tone phase shift mask, dummy patterns stacked with two patterns, the chrome pattern 22 and the half-tone phase shift pattern, are formed on the boundary regions between the cell and the peripheral circuit. Since the dummy patterns are formed considering the process margin, they can be omitted in the half-tone phase shift mask according to the present invention.

Figure 3:
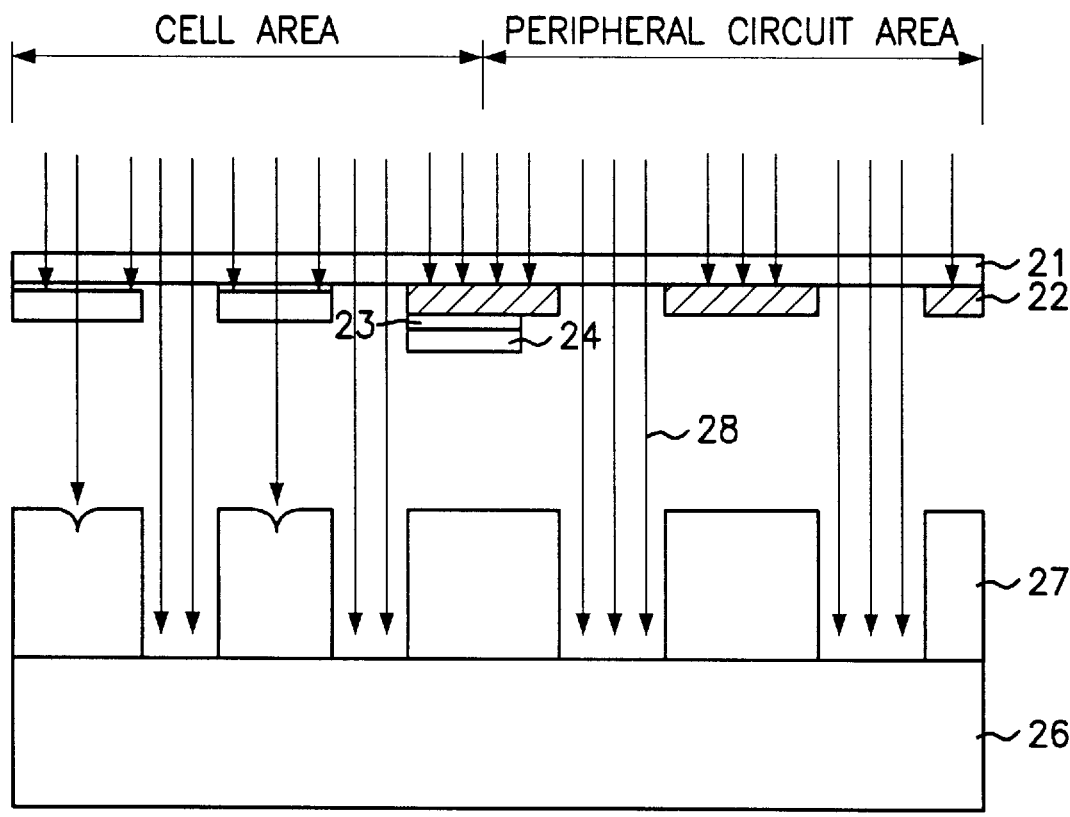
FIG. 3 is a cross sectional view of photosensitive film patterns with a half-tone phase shift mask according to the present invention.

In FIG. 3, positive photosensitive film patterns 27 formed on a semiconductor substrate 26 is shown with the half-tone phase shift mask, according to the present invention, and the supposed path of the incident light 28. As shown in FIG. 3, uneven surface in large patterns formed with chrome patterns 22 is especially reduced as compared with that, which is generated in the photolithography process using a conventional half-tone phase shift mask.

Although the preferred embodiments of the present invention have been disclosed for illustrative purposes, those skilled in the art will appreciate that various modifications, additions and substitutions are possible, without departing from the scope and the spirit of the present invention as disclosed in the accompanying claims.

What is claimed is:

1. A photomask for forming photoresist patterns in a semiconductor device, the photomask comprising:

a transparent substrate;

half-tone phase shift patterns disposed on a first part of said substrate, wherein said half-tone phase shift patterns are formed with two layers, a transmission layer having a predetermined transmissivity of an incident light and a phase shift material layer formed on said transmission layer; and light screen patterns disposed on a second part of said substrate, blocking the incident light used in a light exposure process.

2. A photomask according to claim 1, wherein said second part is a peripheral circuit area of said semiconductor device, and wherein said first part is a cell area of said semiconductor device.

3. A photomask according to claim 1, wherein said transmission layer is a chrome layer.

4. A photomask according to claim 1, wherein said light screen patterns are made of a chrome layer having a transmissivity of 0% for the incident light.

5. A photomask for simultaneously forming photoresist patterns on a first area in which fine patterns are to be formed and on a second area in which relatively large photoresist patterns are to be formed in a semiconductor device, the photomask comprising:

a transparent substrate;

half-tone phase shift patterns disposed on said first area of said substrate, wherein said half-tone phase shift patterns are formed with two layers, a transmission layer having a predetermined transmissivity of an incident light and a phase shift material layer formed on said transmission layer;

light screen patterns disposed on said second area of said substrate, blocking the incident light used in the light exposure process, wherein said light screen patterns are larger than said half-tone phase shift patterns; and a dummy pattern in a boundary area between said first area in which said half-tone phase shift patterns are formed and said second area in which said light screen patterns are formed.

6. A photomask according to claim 5, wherein said first area is a cell area of said semiconductor device, and wherein said second area is the rest area of said semiconductor device.

7. A photomask according to claim 6, wherein said transmission layer is a chrome layer.

8. A photomask according to claim 5, wherein said light screen patterns are made of a chrome layer having a transmissivity of 0% for the incident light.

* * * * *